United States Patent
Park et al.

(10) Patent No.: US 9,601,207 B2
(45) Date of Patent: *Mar. 21, 2017

(54) SEMICONDUCTOR MEMORY DEVICE AND METHOD OF OPERATING THE SAME

(71) Applicant: SK hynix Inc., Icheon-si, Gyeonggi-do (KR)

(72) Inventors: Yong Dae Park, Seongnam-si (KR); Eun Seok Choi, Seongnam-si (KR); Jung Ryul Ahn, Namyangju-si (KR); Se Hoon Kim, Gunpo-si (KR); In Geun Lim, Seoul (KR); Jung Seok Oh, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/867,698

(22) Filed: Sep. 28, 2015

(65) Prior Publication Data

US 2016/0019966 A1    Jan. 21, 2016

Related U.S. Application Data

(63) Continuation of application No. 13/721,014, filed on Dec. 19, 2012, now Pat. No. 9,176,873.

(30) Foreign Application Priority Data

Aug. 29, 2012   (KR) .................. 10-2012-0095114

(51) Int. Cl.
| | |
|---|---|
| *G06F 12/00* | (2006.01) |
| *G11C 16/10* | (2006.01) |
| *G06F 12/06* | (2006.01) |
| *G11C 11/56* | (2006.01) |
| *H01L 27/115* | (2006.01) |
| *G11C 16/04* | (2006.01) |

(52) U.S. Cl.
CPC .............. *G11C 16/10* (2013.01); *G06F 12/06* (2013.01); *G11C 11/56* (2013.01); *G11C 11/5628* (2013.01); *G11C 16/0483* (2013.01); *H01L 27/11582* (2013.01)

(58) Field of Classification Search
CPC ..................................... G11C 16/10
See application file for complete search history.

(56) References Cited

U.S. PATENT DOCUMENTS

2010/0322000 A1 * 12/2010 Shim ................... G11C 11/5628
                                                                365/185.03

* cited by examiner

*Primary Examiner* — Prasith Thammavong
*Assistant Examiner* — Edmund Kwong
(74) *Attorney, Agent, or Firm* — William Park & Associates Ltd.

(57) ABSTRACT

A semiconductor memory device is operated by, inter alia, performing least significant bit programs for pages in a first page group, performing least significant bit programs for pages in a second page group, and performing most significant bit programs for the pages in the first page group. The distance between the second page group and the common source line is greater than that between the first page group and the common source line.

8 Claims, 15 Drawing Sheets

FIG. 16
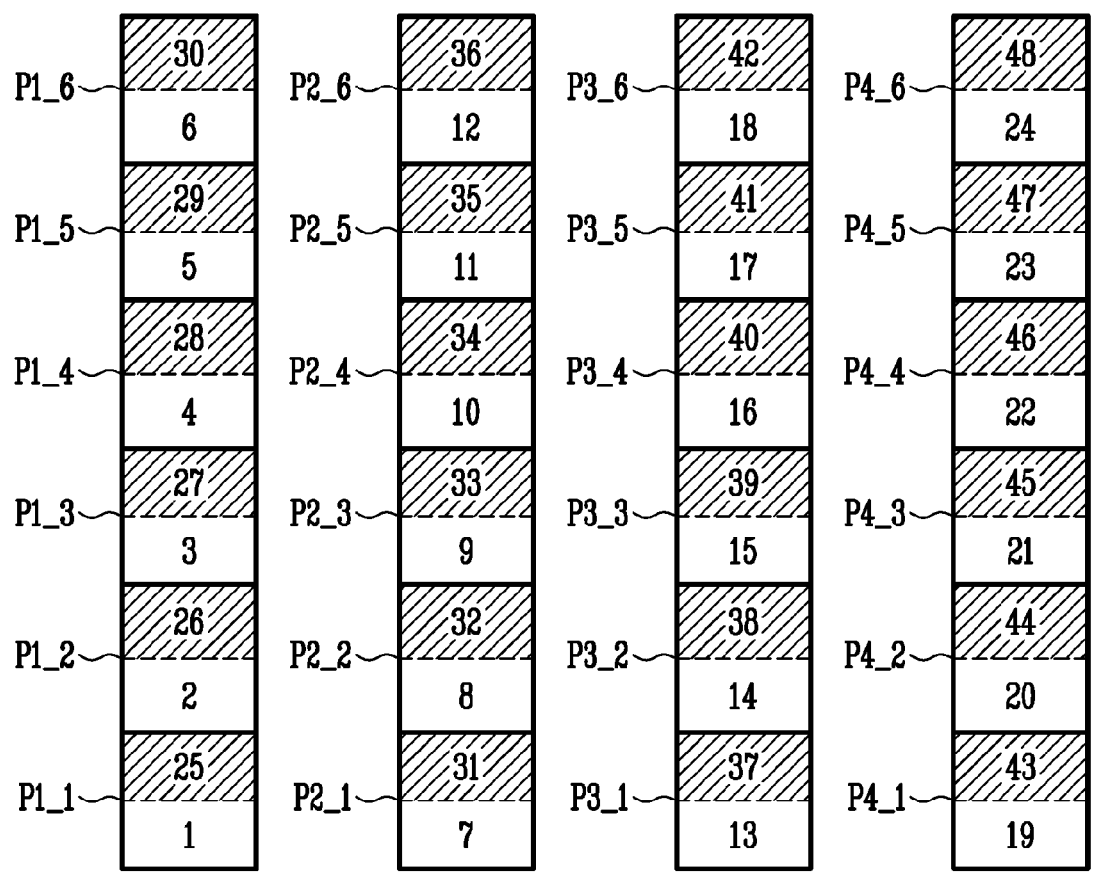
 Most significant bit program
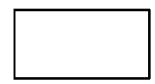 Least significant bit program

SEMICONDUCTOR MEMORY DEVICE AND METHOD OF OPERATING THE SAME

CROSS-REFERENCE TO RELATED APPLICATION

This application claims priority from Korean Patent Application No. 10-2012-0095114, filed on Aug. 29, 2012, in the Korean Intellectual Property Office, the contents of which are incorporated herein by reference in its entirety.

BACKGROUND

Various embodiments relate generally to a semiconductor memory device and a method of operating the same.

Either non-volatile or volatile type of semiconductor memory devices utilizes a semiconductor material such as silicon Si, germanium Ge, gallium arsenide GaAs, indium phosphide InP, etc.

A volatile memory device would lose the stored data if power is not supplied. The volatile memory device includes a static RAM 'SRAM', a dynamic RAM 'DRAM', a synchronous DRAM 'SDRAM' and so on. A non-volatile memory device on the other hand retains the stored data even though power is not supplied. The non-volatile memory device includes a read only memory 'ROM', a programmable ROM 'PROM', an electrically programmable ROM 'EPROM', an electrically erasable and programmable ROM 'EEPROM', a flash memory, a phase-change RAM 'PCRAM', a magnetic RAM 'MRAM', a resistive RAM 'ReRAM', a ferroelectric RAM 'FeRAM', etc. Flash memory devices are generally of a NOR or NAND type.

In recent, implementing a three-dimensional array structure in a semiconductor memory device has been an area of study to enhance its integrity and high integration.

SUMMARY OF THE INVENTION

A method of operating a semiconductor memory device according to an embodiment of the present invention includes performing least significant bit programs to pages of a first page group; performing least significant bit programs to pages of a second page group, wherein a distance between the second page group and the common source line is higher than that between the first page group and the common source line; and performing most significant bit programs to the pages in the first page group.

The method may further include performing least significant bit programs about pages in a third page group after the most significant bit programs are performed, wherein a distance between the third page group and the common source line is greater than that between the second page group and the common source line.

A method of operating a semiconductor memory device according to an embodiment of the present invention includes programming pages of a first cell string group of the cell string groups; and programming pages of a second cell string group adjacent to the first cell string group.

The programming of the pages in the first cell string group may include performing most significant bit programs for the pages of the first cell string group after least significant bit programs for the pages of the first cell string group are performed.

The programming of the pages in the second cell string group may include performing most significant bit programs for the pages of the second cell string group after least significant bit programs for the pages of the second cell string group are performed.

The programming of the pages in the first cell string group may include performing least significant bit program and most significant bit program about a first page of the first cell string group; and performing least significant bit program and most significant bit program about a second page of the first cell string group, wherein distance between the second page and the common source line is greater than that between the first page and the common source line.

The programming of the pages of the second cell string group may include performing least significant bit program and most significant bit program about a third page of the second cell string group; and performing least significant bit program and most significant bit program about a fourth page of the second cell string group, wherein distance between the fourth page and the common source line is greater than that between the third page and the common source line.

A method of operating a semiconductor memory device according to an embodiment of the present invention includes performing least significant bit programs to pages of a first cell string group of the cell string groups; performing least significant bit programs to pages of a second cell string group adjacent to the first cell string group; performing most significant bit programs to the pages of the first cell string group; and performing most significant bit programs to the pages in the second cell string group.

A method of programming a page group of a semiconductor memory device including a cell string group having a plurality of pages connected to a bit line, and a page group having a plurality of pages connected to a word line, comprises sequentially performing least significant bit programs to the plurality of pages of the page group; and sequentially performing most significant bit programs to the plurality of pages completed the least significant bit programs.

A method of programming a cell string group of a semiconductor memory device including a cell string group having a plurality of pages connected to a bit line, and a page group having a plurality of pages connected to a word line, comprises individually performing least significant bit program and most significant bit program to every page of the page group.

BRIEF DESCRIPTION OF THE DRAWINGS

The above and other features and advantages of the present invention will become readily apparent by reference to the following detailed description when considered in conjunction with the accompanying drawings wherein:

FIG. 16 is a view illustrating operation of the semiconductor memory device in FIG. 15.

DETAILED DESCRIPTION

Hereinafter, the embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "coupled" or "coupled" to another element, it can be directly coupled or coupled to the other element or intervening elements may be present. In contrast, when an element is referred to as being "directly coupled" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
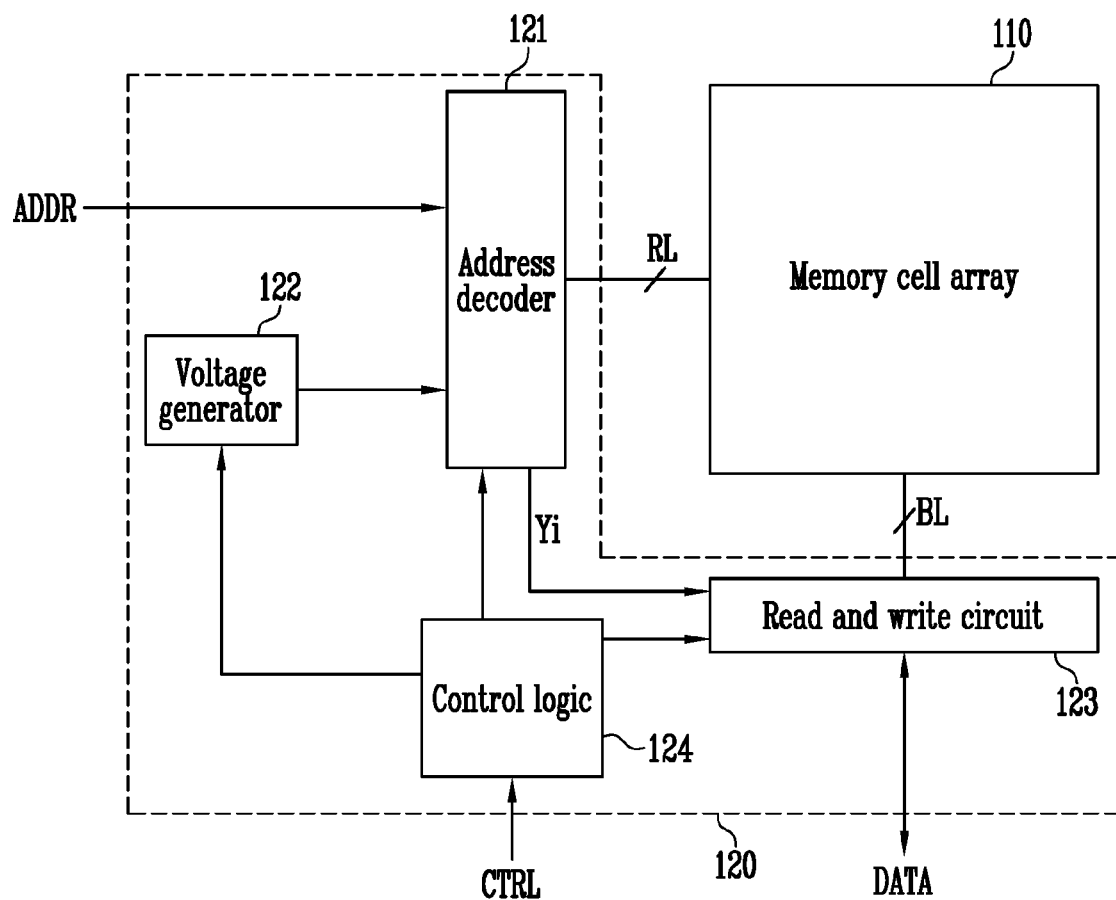
FIG. 1 is a block diagram illustrating a semiconductor memory device according to an example embodiment of the present invention.

FIG. 1 is a block diagram illustrating a semiconductor memory device according to an embodiment of the present invention.

In FIG. 1, the semiconductor memory device 100 may include a memory cell array 110 and a peripheral circuit 120.

The memory cell array 110 is coupled to an address decoder 121 through row lines RL. The memory cell array 110 is coupled to a read and write circuit 123 through bit lines BL. The memory cell array 110 includes a plurality of memory blocks (not shown). Each of the memory blocks includes a plurality of cell strings (not shown). The cell strings include a plurality of memory cells stacked on a substrate, respectively. In an embodiment of the present invention, the memory cells may be non-volatile memory devices. The memory cell array 110 will be described in detail with reference to the accompanying drawings FIG. 2 to FIG. 7.

The peripheral circuit 120 is configured to drive the memory cell array 110. The peripheral circuit 120 may include an address decoder 121, a voltage generator 122, the read and write circuit 123 and a control logic 124.

The address decoder 121 is coupled to the memory cell array 110 through the row lines RL. The row lines RL may include a drain select line, word lines, a source select line and a common source line. The address decoder 121 is configured to drive the row lines RL in response to control of the control logic 124. The address decoder 121 receives an address ADDR from an external device (not shown) or an input/output buffer (not shown) in the semiconductor memory device 100.

The address decoder 121 is configured to decode a block address of the received address ADDR. The address decoder 121 selects at least one memory block according to the decoded block address.

The address decoder 121 is configured to decode a row address of the received address ADDR. The address decoder 121 selects one of the drain select lines coupled to a selected memory block or one of word lines coupled to the selected memory block according to the decoded row address.

The address decoder 121 is configured to decode a column address of the received address ADDR. The address decoder 121 transfers the decoded column address Yi to the read and write circuit 123.

The semiconductor memory device 100 may perform a program operation in the unit of a page. The address ADDR may include a block address, the row address and the column address when programming is requested. The address decoder 121 may select one memory block, one drain select line and one word line according to the address ADDR, and may provide the decoded column address Yi to the read and write circuit 123.

In one embodiment, the address decoder 121 may include a block decoder, a row decoder, a column decoder and an address buffer, etc.

The voltage generator 122 is configured to generate a plurality of voltages using an external voltage supplied to the semiconductor memory device 100. The voltage generator 122 may operate in response to control of the control logic 124. The plurality of the voltages generated from the voltage generator 122 is used as voltages supplied to the memory cell array 110. The voltage generator 122 may include a circuit for generating a supply voltage by regulating the external voltage. It is also possible that the voltage generator 122 may include pumping capacitors and generate voltages by selectively activating the pumping capacitors. The generated voltages are supplied to the address decoder 121.

The read and write circuit 123 is coupled to the memory cell array 110 through the bit lines BL. The read and write circuit 123 may operate in response to control of the control logic 124.

In the program operation, the read and write circuit 123 receives data DATA to be programmed from the external device or the input/output buffer (not shown) of the semiconductor memory device 100. The read and write circuit 123 is configured to transfer the received data DATA to bit lines selected by the decoded column address Yi. The data DATA which loaded in the bit lines is programmed in the selected memory cells.

The read and write circuit 123 may include page buffers (or page registers) and a column select circuit, etc.

The control logic 124 is coupled to the address decoder 121, the voltage generator 122 and the read and write circuit 123, respectively. The control logic 124 receives a control signal CTRL from the external device or the input/output buffer (not shown) of the semiconductor memory device 100. The control logic 124 is configured to control all circuits of the semiconductor memory device 100 in response to the control signal CTRL.

The semiconductor memory device 100 may further include the input/output buffer (not shown). The input/output buffer receives the control signal CTRL and the address ADDR from the external device, and transfers the received control signal CTRL and the address ADDR to the control logic 124 and the address decoder 121, respectively. Additionally, the input/output buffer transfers external data DATA to the read and write circuit 123.

The semiconductor memory device 100 may be a flash memory device.

Figure 2:
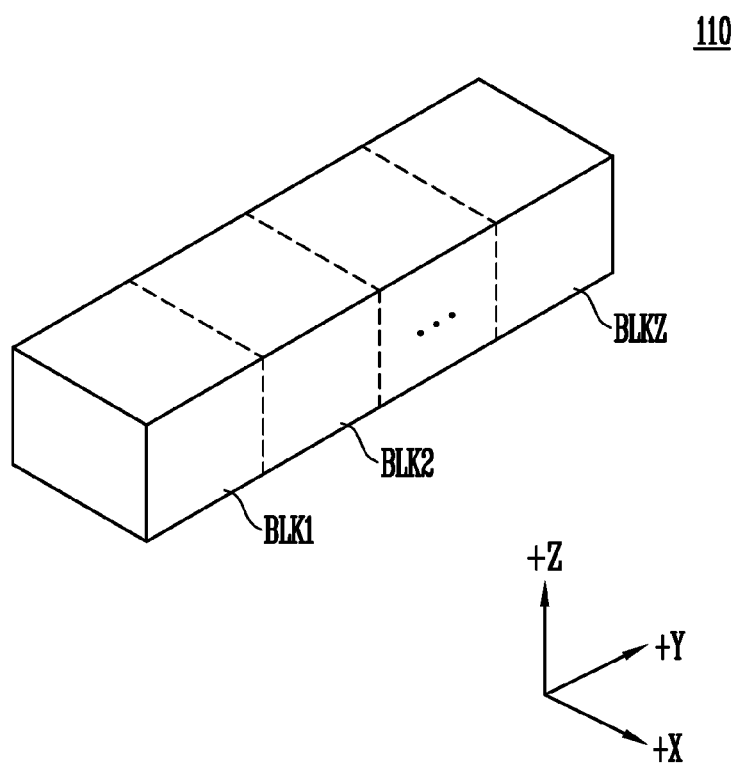
FIG. 2 is a block diagram illustrating a memory cell array in FIG. 1 according to an embodiment of the present invention.

FIG. 2 is a block diagram illustrating a memory cell array in FIG. 1 according to one embodiment of the present invention.

Referring to FIG. 2, the memory cell array 110 may include a plurality of memory blocks BLK1~BLKz. Each of the memory blocks may be formed of three-dimensional structure. Each of the memory blocks may include structures extended in an X-axis direction, an Y-axis direction and a Z-axis direction. Each of the memory blocks may have cell strings disposed in the Y-axis direction and the Z-axis direction. Each of the cell strings is a structure extended and stacked in the Z-axis direction. The structure of the memory block will be described in detail with reference to accompanying drawings FIG. 3 to FIG. 7.

Figure 3:
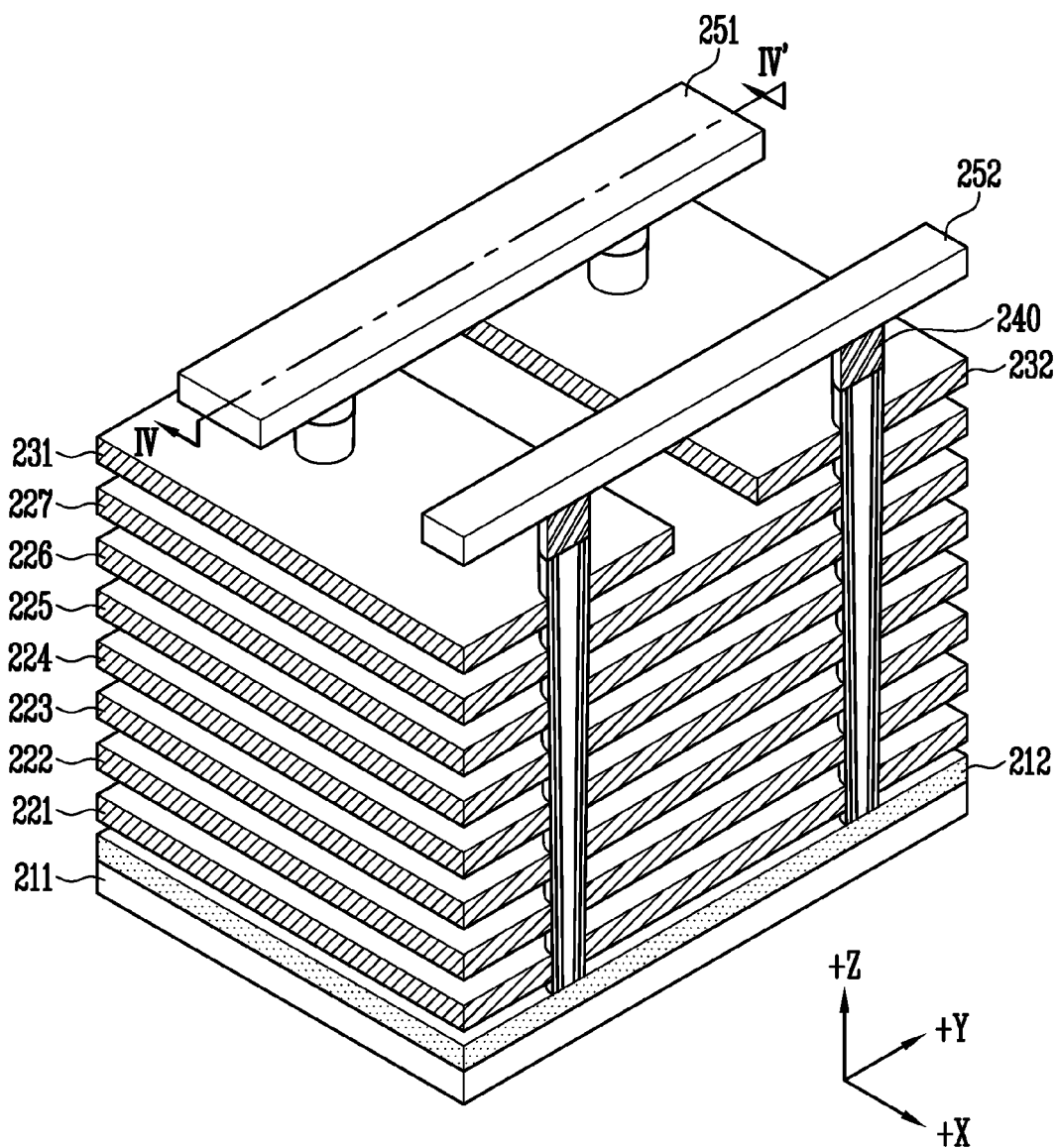
FIG. 3 is a perspective view illustrating one of memory blocks in FIG. 2 according to an embodiment of the present invention.

FIG. 3 is a perspective view illustrating one of memory blocks BLK1~BLKz in FIG. 2 according to one embodiment of the present invention.

Figure 4:
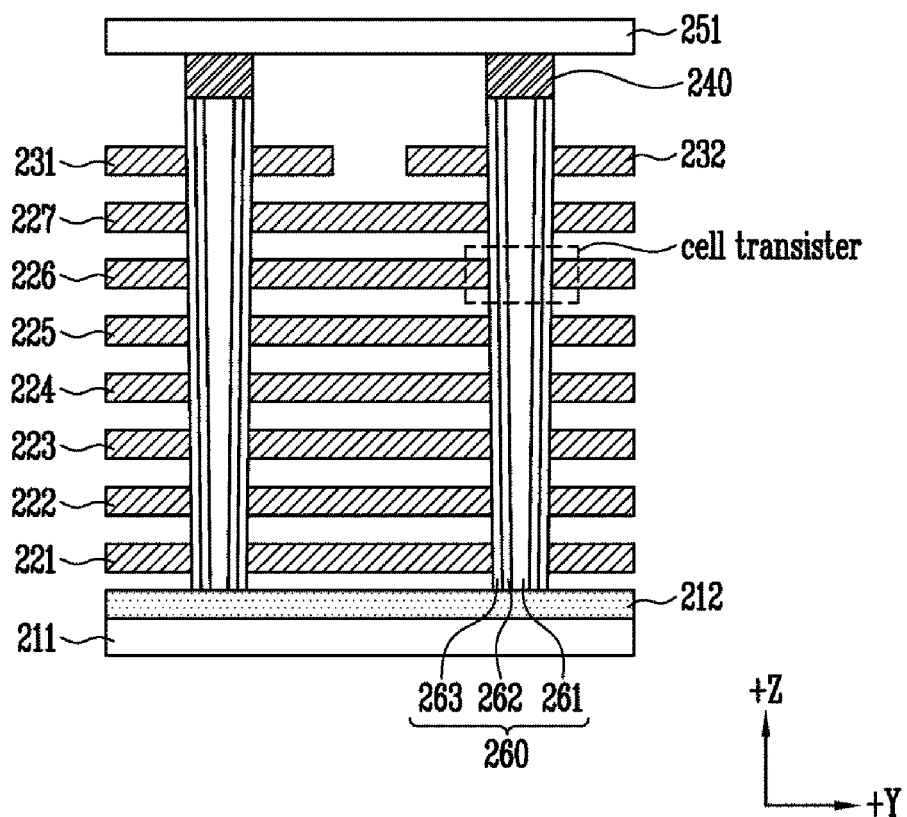
FIG. 4 is a sectional view illustrating a memory block taken along the line IV-IV' in FIG. 3.

In FIG. 3 and FIG. 4, a second-type (e.g. n-type) doped area 212 (hereinafter, doping area) may be formed in a first-type (e.g. p-type) substrate 211 and the doping area 212 may be a common source line. The substrate 211 may be provided as a pocket p-well in an n-well.

A first to a seventh conductive material layers 221 to 227 are provided on the doping area 212 in the z-axis direction. The first to the seventh conductive material layers 221 to 227 are spaced apart for insulating among the first to the seventh conductive material layers 221 to 227. The first conductive material layers 221 are separated from the doping area 212. Each of the first to the seventh conductive material layers 221 to 227 is extended in the X-axis direction and the Y-axis direction. Eight conductive material layers 231 and 232 are disposed with spaced from the seventh conductive material layer 227 in the z-axis direction. The eighth conductive material layers 231 and 232 are spaced each other in the Y-axis direction. The first to the seventh conductive material layers 221 to 227 and the eight conductive material layers 231 and 232 may be formed of a poly silicon material.

Although it is not shown in FIG. 3 and FIG. 4, insulating material layers may be formed among the first to the seventh conductive material layers 221 to 227 and the eight conductive material layers 231 and 232. The insulating material layers may include for example silicon oxide.

Hereinafter, it is assumed that each of the first to the seventh conductive material layers 221 to 227 has a first to a seventh height, and the eight conductive materials 232 and 232 have an eight height.

A plurality of pillars 260 may be formed through the first to the seventh conductive material layers 221 to 227 and the eighth conductive material layers 231 and 232, and they being spaced one another in the X-axis direction and the Y-axis direction. Each of the pillars 260 is extended in the Z-axis direction. Width of each of the pillars 260 in the X-axis direction and the Y-axis direction may reduce according as a distance between the pillars 260 and the substrate 211 becomes smaller.

Each of the pillars 260 may include an internal material layer 261, a middle layer 262 and a surface layer 263. The internal material layer 261 may include an insulating material. For example, the internal material layer 261 may include a silicon oxide or an air gap. The middle layer 262 may include a silicon material doped with the first-type. The middle layer 262 may be a channel (C in FIG. 11 and FIG. 12) formed in the Z-axis direction. The surface layer 263 is a layer for storing data. For example, the surface layer 263 may be formed of a structure which disposed a tunnel insulating layer, an electric charge storage layer and a blocking insulating layer in sequence from the middle layer 262.

In one embodiment, the tunnel insulating layer may include a thermal oxide layer. The electric charge storage layer may include a silicon nitride layer or a metal oxide layer. The blocking insulating layer may include a dielectric layer having a dielectric constant being higher than dielectric constants of the tunnel insulating layer and the electric charge storage layer.

Drains 240 may be formed on the pillars 260. Each of the drains 240 may include for example silicon material doped with the second-type. A plurality of upper conductive material layers 251 and 252 extended in the Y-axis direction are formed on the drains 240. The plurality of the upper conductive material layers 251 and 252 are spaced each other in the X-axis direction.

The upper conductive material layers 251 and 252 may be formed of a metal layer or a doped poly silicon layer. The upper conductive material layers 251 and 252 may be a bit line. One of the pillars 260 and parts of the conductive material layer that surrounds the pillar 260 may operate as one cell transistor. That is, the middle layer 262 of the pillar 260 operating as a channel, the surface layer 263 including the tunnel insulating layer, the electric charge storage layer and the blocking insulating layer, and the conductive material layer operating as a control gate may form one cell transistor.

Each of the pillars 260 overlaps with one of the conductive material layers 221 to 227 having the first to the seventh heights and the eighth conductive material layers 231 and 232 having the eighth height. Accordingly, one pillar corresponds to eight cell transistors. If one pillar 260 corresponds to one cell string, each of the cell strings may include a first cell transistor to an eighth cell transistor.

Eight conductive material layers 221~227, 231 and 232 are shown in FIG. 3 and FIG. 4 as the control gate or the word line. However, the present invention may include nine or more conductive material layers or seven or less conductive material layers.

Although in FIG. 3 and FIG. 4, two pillars are coupled to one bit line (i.e., the upper conductive material layer), but three or more pillars could be coupled to one bit line.

Two bit lines 251 and 252 are shown in FIG. 3 and FIG. 4. However, the memory block may include three or more bit lines.

That is, N bit lines may be provided in the semiconductor memory device, N being a positive integer. One bit line may be coupled to M pillars, M being a positive integer.

Figure 5:
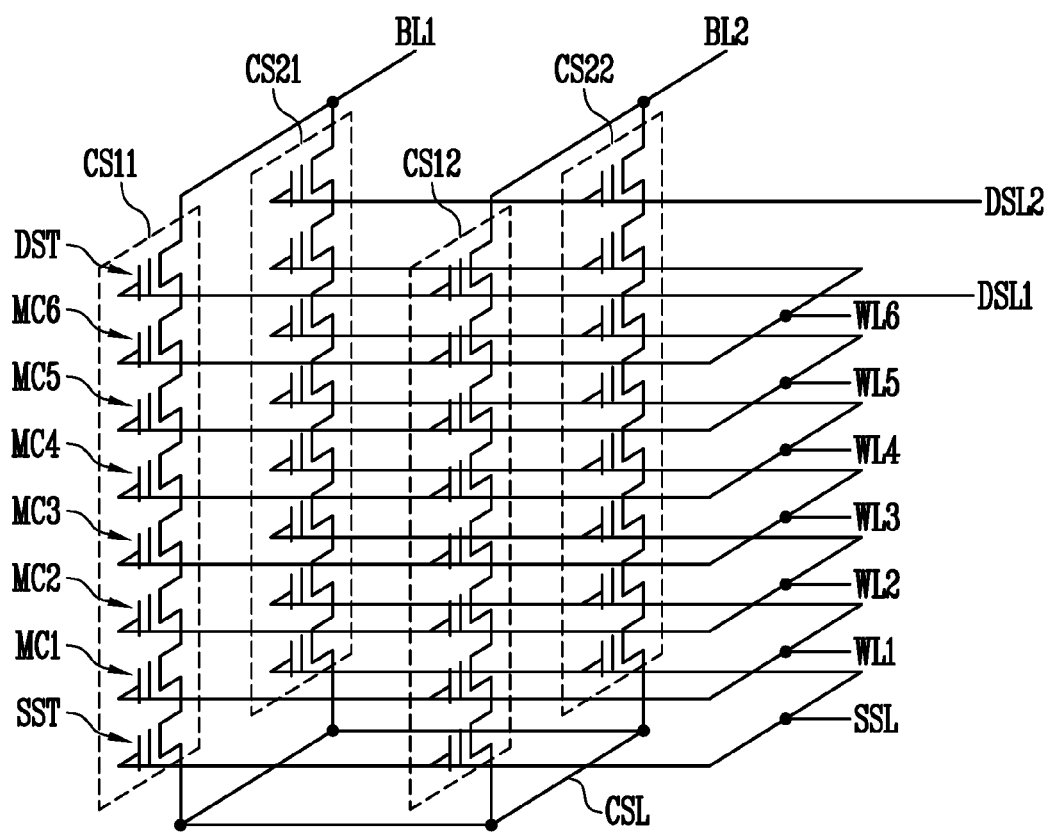
FIG. 5 is a view illustrating equivalent circuit of the memory block in FIG. 3 and FIG. 4.

FIG. 5 is a view illustrating equivalent circuit of the memory block in FIG. 3 and FIG. 4.

Referring to FIG. 3 to FIG. 5, the second-type doping area 212 may operate as a common source line CSL. The first conductive material layer 221 having first height may operate as a source select line SSL. The second to the seventh conductive material layers 222 to 227 having a second height to the seventh height may operate as a first to a sixth word lines WL1 to WL6, respectively. The eighth conductive material layers 231 and 232 having the eighth height may operate as a first drain select line DSL1 and a second drain select line DSL2. The first and the second upper conductive material layers 251 and 252 may operate as a first bit line BL1 and a second bit line BL2, respectively.

As shown in FIG. 3 and FIG. 4, each of the pillars 260 may correspond to one cell string CS. Since four pillars are shown in FIG. 3, the memory block BLK1 includes four cell strings CS11, CS12, CS21 and CS22.

Hereinafter, the cell strings CS11, CS12, CS21 and CS22 are defined in the unit of row and column.

The cell strings coupled in common to one bit line may be defined as one column. The cell strings CS11 and CS21 coupled to the first bit line BL1 may correspond to a first column. The cell strings CS12 and CS22 coupled to the second bit line BL2 may correspond to a second column.

The cell strings coupled to one drain select line may be defined as one row. The cell strings CS11 and CS12 coupled to the first drain select line DSL1 may correspond to a first row. The cell strings CS21 and CS22 coupled to the second drain select line DSL2 may correspond to a second row.

As shown in FIG. 3 and FIG. 4, each of the cell strings CS includes the cell transistors having the first to the eight heights. The cell transistor having the first height in each of the cell strings CS operates a source select transistor SST. The cell transistors having the second to the seventh heights in each of the cell strings CS operate as a first to a sixth memory cells MC1 to MC6. The cell transistor having the eighth height in each of the cell strings CS operates as a drain select transistor DST. The select transistors SST and DST and the memory cells MC1 to MC6 may have substantially the same structure.

The source select transistors SST in the cell strings CS are coupled in common to the source select line SSL.

The memory cells having substantially the same height may be coupled in common to one word line. The first to the sixth memory cells MC1 to MC6 in each of the cell strings CS are coupled to the first to the sixth word lines WL1 to WL6, respectively.

The drain select transistors DST which are positioned in the same row are coupled to the same drain select line DSL. The drain select transistors DST which are positioned in different row are coupled to different drain select lines DSL1 and DSL2. For example, the drain select transistor DST in each of the cell strings CS11 and CS12 in the first row is coupled to the first drain select line DSL1. The drain select transistor DST in each of the cell strings CS21 and CS22 in the second row is coupled to the second drain select line DSL2.

The cell strings CS11, CS12, CS21 and CS22 may be electrically coupled or decoupled to the bit lines BL1 and BL2 by selection of the drain select lines DSL1 and DSL2. When the drain select line DSL1 is selected, the cell strings CS11 and CS12 coupled to the selected drain select line DSL1 are electrically coupled to the bit lines BL1 and BL2. When the drain select line DSL2 is selected, the cell strings CS21 and CS22 coupled to the selected drain select line DSL1 are electrically coupled to the bit lines BL1 and BL2.

The memory cells arranged in same row may form one page. For example, the memory cells, included in the cell strings CS11 and CS12 in the first row, having the second height form one page, and the memory cells, included in the cell strings CS21 and CS22 in the second row, of the memory cells having the second height form another page A program operation is performed in the unit of page. For example, in the program operation, the drain select lines DSL1 is selected, and one word line selected. Then, the memory cells coupled to the selected word line of the cell strings CS11 and CS12 coupled to the selected drain select line DSL1 will be programmed.

Figure 8:
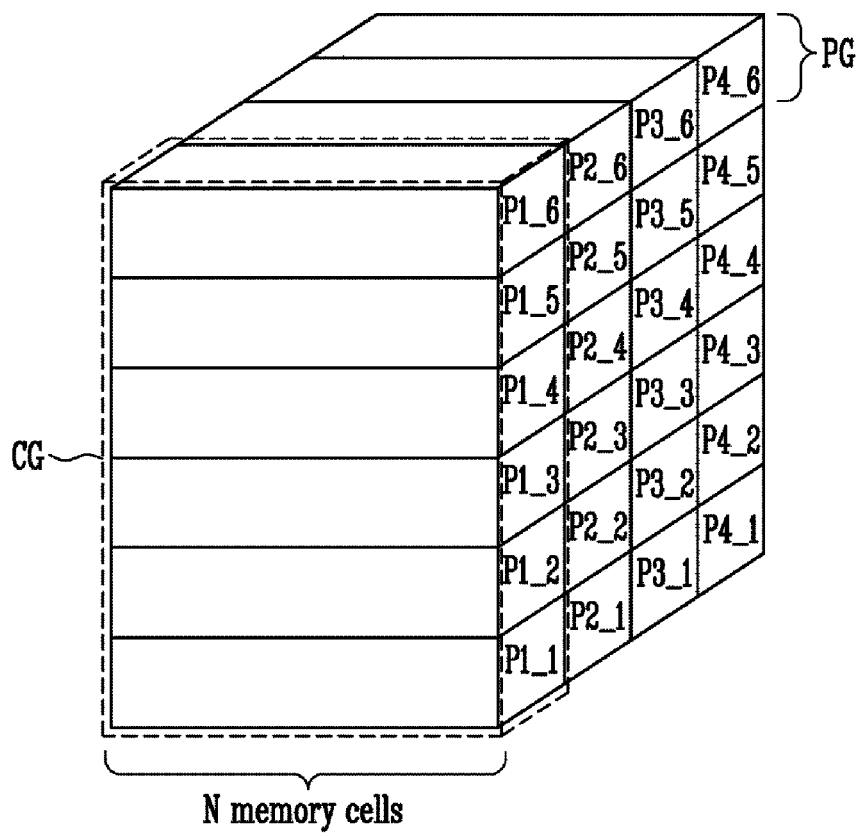
FIG. 8 is a block diagram illustrating pages in the memory block BLK1 in FIG. 1.

In one embodiment of the present invention, the cell strings in one row may be defined as one cell string group (e.g. CG in FIG. 8). That is, the cell strings coupled to the drain select line are defined as one cell string group. The cell strings CS11 and CS12 in the first row are defined as one cell string group, and the cell strings CS21 and CS22 in the second row are defined as another cell string group. In one embodiment of the present invention, pages having the same height may be defined as one page group (e.g. PG in FIG. 8). In other words, the pages coupled to one word line are defined as one page group. This will be described in detail with reference to accompanying drawing FIG. 8.

Figure 6:
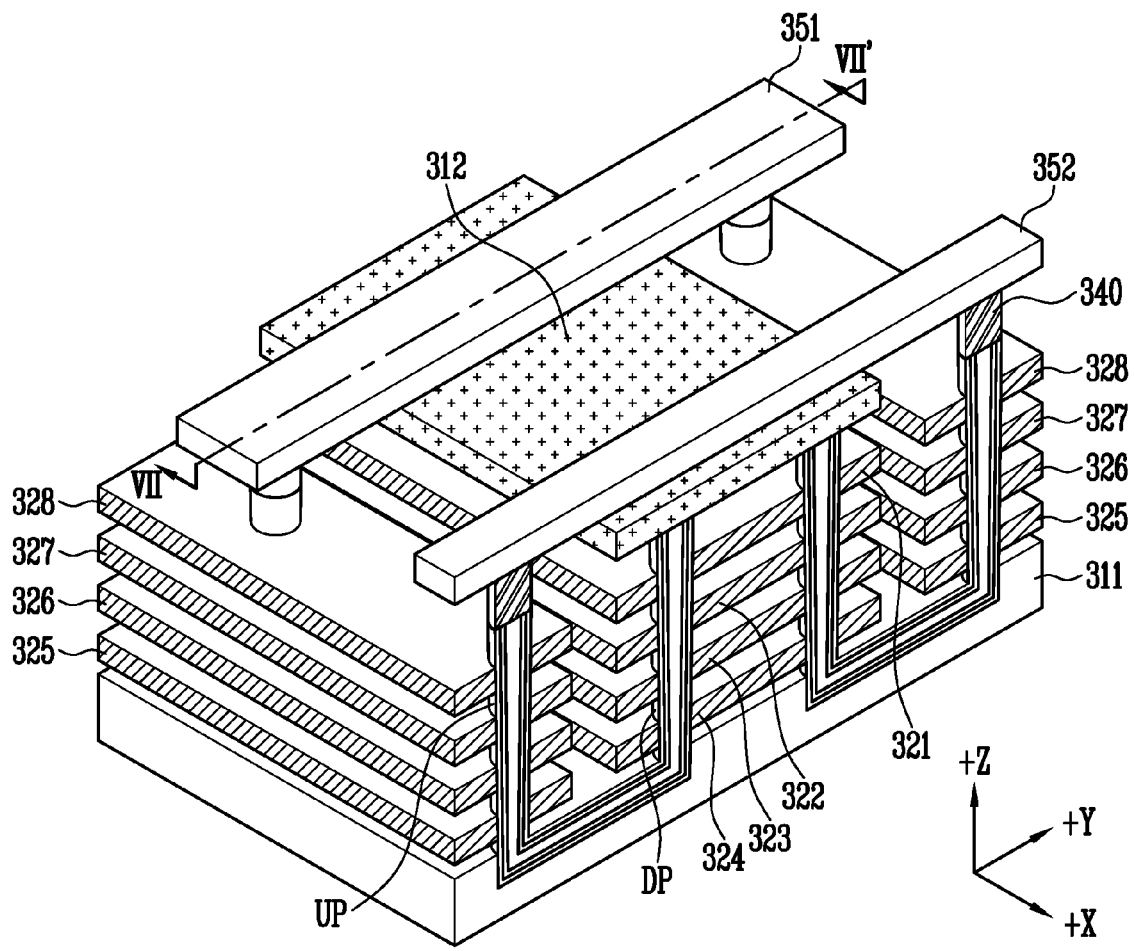
FIG. 6 is a perspective view illustrating one of the memory blocks in FIG. 2 according to an embodiment of the present invention.
Figure 7:
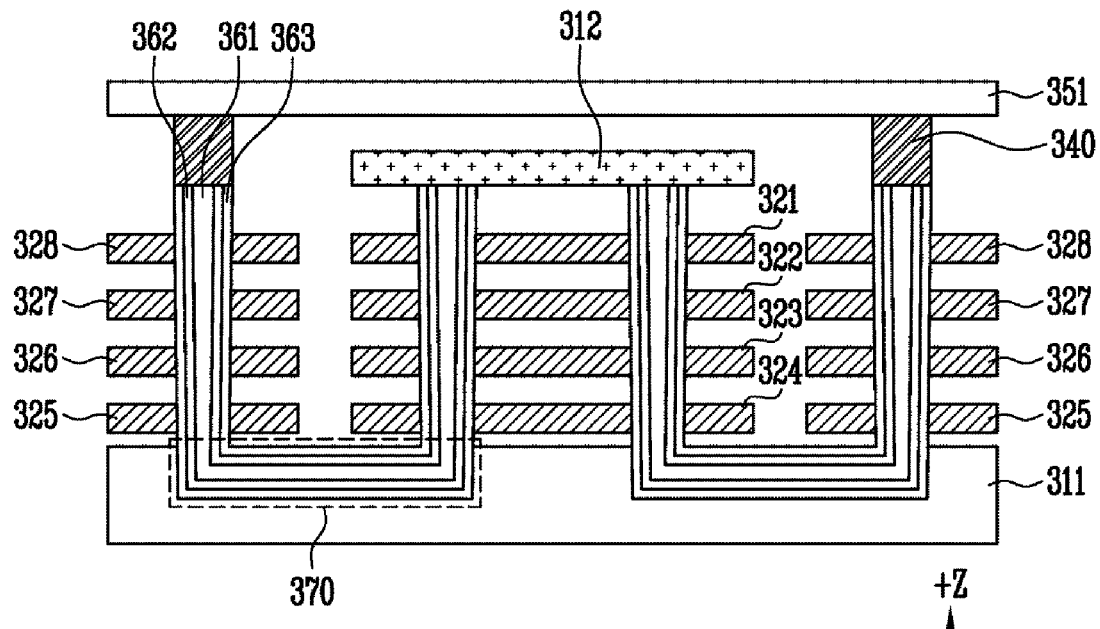
FIG. 7 is a sectional view illustrating a memory block taken along the line VII-VII' in FIG. 6.

FIG. 6 is a perspective view illustrating one of the memory blocks in FIG. 2 according to another embodiment of the present invention. FIG. 7 is a sectional view illustrating a memory block taken along the line VII-VII' in FIG. 6.

Referring to FIG. 6 and FIG. 7, a first to a fourth conductive material layers 321 to 324 may be disposed on a substrate 311, they being extended in an X-axis direction and an Y-axis direction. The first to the fourth conductive material layers 321 to 324 are spaced in a Z-axis direction.

A fifth to an eighth conductive material layers 325 to 328 may be disposed on the substrate 311, they being extended in the X-axis direction and the Y-axis direction. The fifth to the eight conductive material layers 325 to 328 are spaced in a Z-axis direction. The fifth to the eighth conductive material layers 325 to 328 are spaced from the first to the fourth conductive material layers 321 to 324 in the Y-axis direction.

A plurality of lower pillars DP may be formed through the first to the fourth conductive material layers 321 to 324. Each of the lower pillars DP is extended in the Z-axis direction. A plurality of upper pillars UP may be formed through the fifth to the eighth conductive material layers 325 to 328. Each of the upper pillars UP is extended in the Z-axis direction.

Each of the lower pillars DP and the upper pillars UP may include an internal material layer 361, a middle layer 362 and a surface layer 363. In the same manner in FIG. 3 and FIG. 4, the middle layer 362 may operate as a channel of the cell transistor. The surface layer 363 may include a blocking insulating layer, an electric charge storage layer and a tunnel insulating layer.

The lower pillar DP and the upper pillar UP may be coupled through a pipe gate 370. The pipe gate 370 may be formed in the substrate 311. In one embodiment of the present invention, the pipe gate 370 may be formed of substantially same materials as the lower pillar DP and the upper pillar UP.

A doping material layer 312 with a second-type may be disposed on the lower pillar DP, it being extended in the X-axis direction and the Y-axis direction. For example, the doping material layer 312 may include n-type silicon material. The doping material layer 312 may operate as the common source line (CSL in FIG. 5).

Drains 340 may be formed on each of the upper pillars UP. For example, the drain 340 may include n-type silicon material. A first and a second upper conductive material layers 351 and 352 may be formed on the drains 340, they being extended in the Y-axis direction. The first and the second upper conductive material layers 351 and 352 are spaced each other in the X-axis direction. For example, the first and the second upper conductive material layers 351 and 352 may be made up of a metal material or a doped poly silicon material. In case, the first and the second upper conductive material layers 351 and 352 may be coupled to drains 340 through contact plugs. The first and the second upper conductive material layers 351 and 352 may operate as a first and a second bit lines (BL1 and BL2 in FIG. 5), respectively.

The first conductive material layer 321 may operate as the source select line (SSL in FIG. 5). The second to the seventh conductive material layers 322 to 327 may operate as the second to the seventh word lines (WL2 to WL7 in FIG. 5). The eighth conductive material layer 328 may operate as the drain select line (DSL in FIG. 5).

The lower pillar DP and the first to the fourth conductive material layers 321 to 324 adjacent to the lower pillar DP form a lower string LS. The upper pillar UP and the fifth to the eighth conductive material layers 325 to 328 adjacent to the upper pillar UP form an upper string US. One terminal of the lower string LS is coupled to the second-type doping material layer 312 operating as the common source line CSL. One terminal of the upper string is coupled to corresponding bit line through the drain 320. The lower string LS and the upper string US are coupled through the pipe gate 370. Thus, one lower string LS and one upper string US, which are coupled by the pipe gate 370, may form one cell string coupled between the second-type doping material layer 312 and corresponding bit line.

Consequently, the memory block BLK1b may have equivalent circuit as shown in FIG. 5. That is, the lower string may include a source select transistor SST and a first to a third memory cells MMC1 to MMC3. The upper string may include a fourth to a sixth memory cells MMC4 to MMC6 and a drain select transistor DST.

Embodiments of the three-dimensional memory cell array are described in detail with reference to FIG. 3 to FIG. 7. However, the structure of the three-dimensional memory cell array may be variously modified. The structure of the memory block BLK1 may be variously modified for providing the equivalent circuit in FIG. 5.

Hereinafter, it is assumed that N cell strings are provided in one row and four cell strings are provided in one column. That is, N cell strings are coupled to each of the drain select line DSL, and four cell strings are coupled to each of the bit lines BL. Here, four pages having the same height may be provided, and each of pages may include N memory cells.

FIG. 8 is a block diagram illustrating pages in the memory block BLK1 in FIG. 1.

In FIG. 8, the memory block BLK1 may include pages P. Each of the pages includes N memory cells.

One cell string group CG may include a plurality of stacked pages. In other words, a jth row pages Pj_1~Pj_6 form a jth cell string group, j being a positive integer. For example, stacked pages P1_1~P1_6 in a first row form a first cell string, stacked pages P2_1~P2_6 in a second row form a second cell string, stacked pages P3_1~P3_6 in a third row form a third cell string group, and stacked pages P4_1~P4_6 in a fourth row form a fourth cell string group.

One page group may include a plurality of pages having substantially the same height. That is, pages coupled to one word line are included in one page group PG. Pages P1_k~P4_k coupled a kth word line (WLk in FIG. 5) form a kth page group, k being a positive integer. For example, pages P1_1~P4_1 coupled to the first word line (WL1 in FIG. 5) form a first page group. Pages P1_6~P4_6 coupled to a sixth word line (WL6 in FIG. 5) form a sixth page group.

Each of the memory cells may store multi bits. When a least significant bit program is performed about selected page, each of memory cells in the selected page may store a single bit. Then, in the event that the most significant bit program is performed about the selected page, each of the memory cells in the page stores multi bits.

Figure 9:
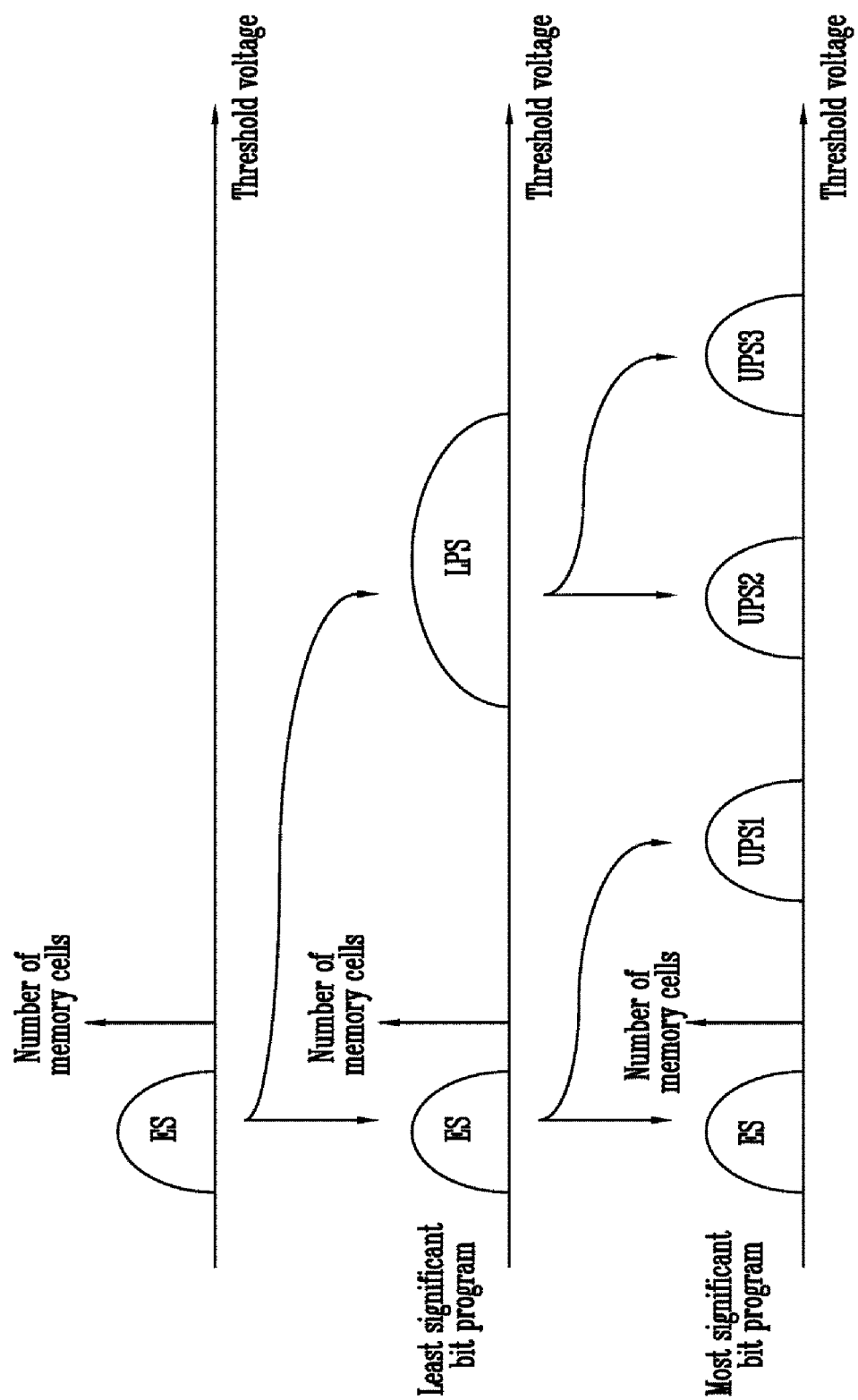
FIG. 9 is a diagram illustrating change of threshold voltage distribution of memory cells in one page when the least significant bit program and the most significant bit program are performed.

FIG. 9 is a diagram illustrating change of threshold voltage distribution of memory cells in one page when the least significant bit program and the most significant bit program are performed. In FIG. 9, a horizontal axis indicates threshold voltage, and a vertical axis shows the number of memory cells.

In FIG. 9, the memory cells have erase state ES before the least significant bit program is performed. If the least significant bit program is performed about the memory cells, the memory cells have erase state E and lower program state LPS. For example, the memory cell having the erase state ES may store data "1", and the memory cell having lower program state LP may store data "0".

In the most significant bit program, the memory cells having erase state ES are programmed to have the erase state ES and first upper program state UPS1. The memory cells having the lower program state LPS are programmed to have second upper program state UPS2 and third upper program state UPS3. For example, the memory cell having the erase state ES may store lower bit data "1" and upper bit data "1". The memory cell having the first upper program state UPS1 may store lower bit data "1" and upper bit data "0". The memory cell having the second upper program state UPS2 may store lower bit data "0" and upper bit data "1". The memory cell having the third upper program state UPS3 may store lower bit data "0" and upper bit data "0".

Margin between states when multi bits are stored in the memory cells is narrower than that between states when single bit is stored in the memory cell. That is, margins among the erase state ES and the first to the third upper program states UPS1 to UPS3 are narrower than margin between the erase state ES and the lower program state LPS. It is assumed that threshold voltages of the memory cells are unintentionally changed after the memory cells are programmed. For example, the threshold voltages of the memory cells in certain page may be changed when a page adjacent to the certain page is programmed. In addition, the threshold voltages of the memory cells in the page may become lower according as a time is elapsed. Accordingly, error probability of data in the memory cell when multi bits are stored in the memory cell may be higher than that of data in the memory cell when single bit is stored in the memory cell. Especially, error probability of most significant data bit in the each of the memory cells may be considerably high.

Figure 10:
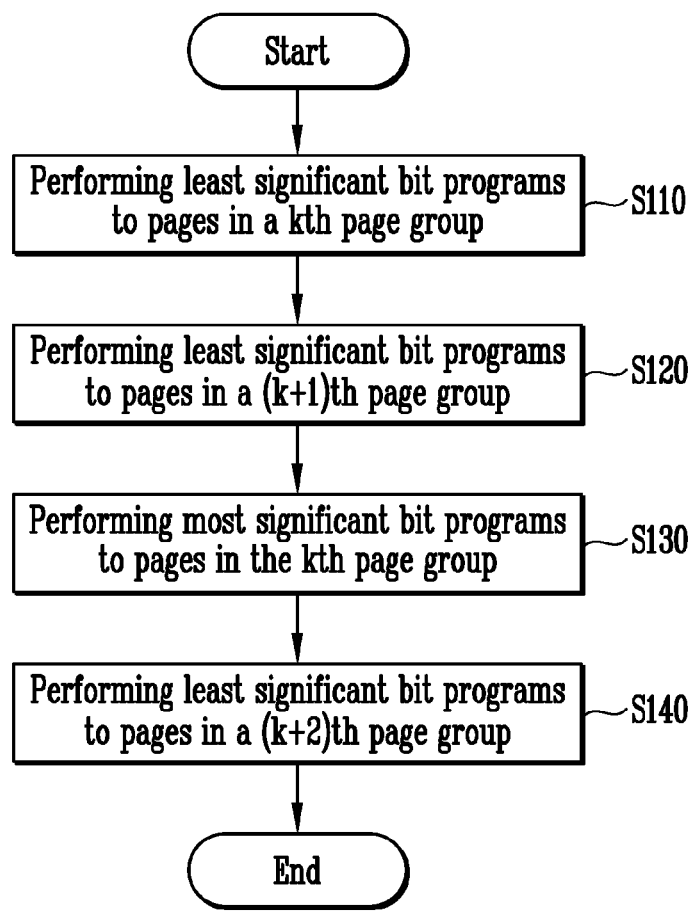
FIG. 10 is a flowchart illustrating operation of a semiconductor memory device according to an embodiment of the present invention.
Figure 11:
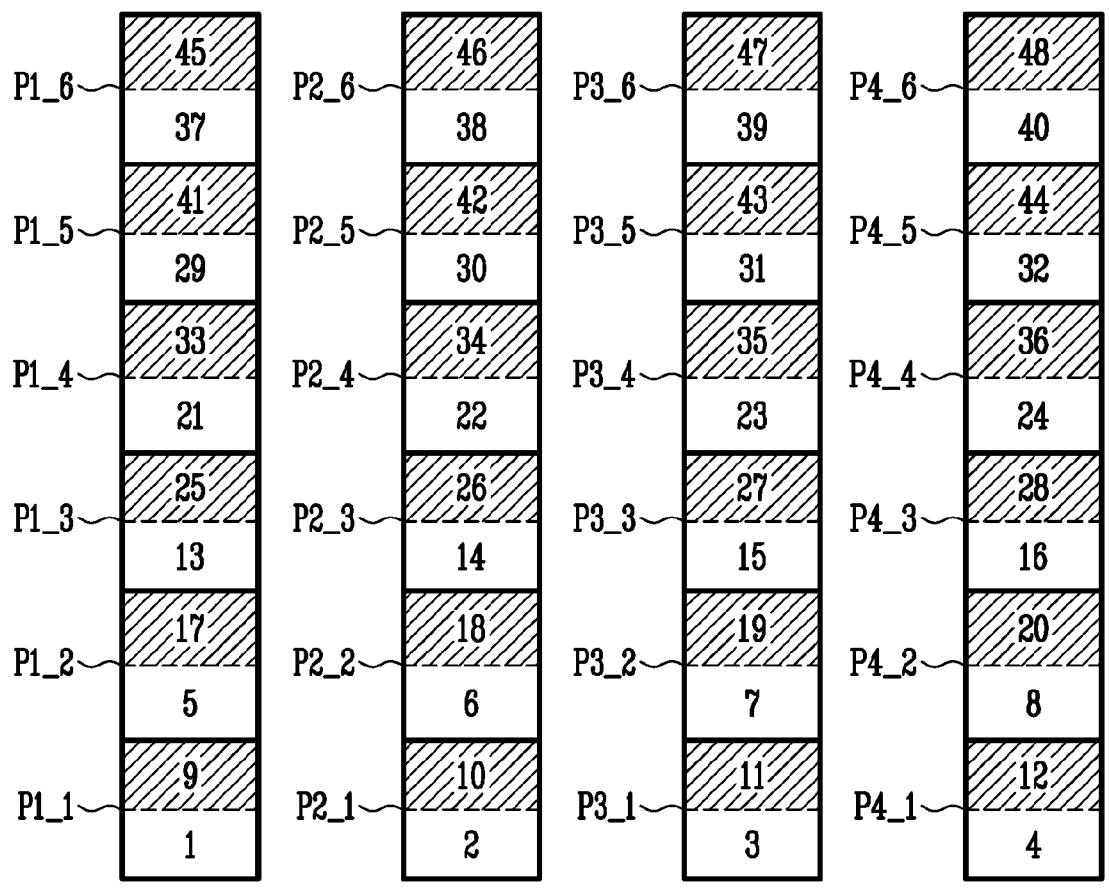
FIG. 11 is a view illustrating operation of the semiconductor memory device in FIG. 10.

FIG. 10 is a flowchart illustrating operation of a semiconductor memory device according to one embodiment of the present invention. FIG. 11 is a view illustrating operation of the semiconductor memory device in FIG. 10. In FIG. 11, order of least significant bit program and most significant bit program is numbered.

Referring to FIG. 8, FIG. 10 and FIG. 11, a least significant bit program is performed about pages of the kth page group in step S110. For example, least significant bit programs for the pages P1_1~P4_1 in the first page group are performed in sequence.

In step S120, least significant bit programs for pages in a (k+1)th page group adjacent to the kth page group are performed. Here, a distance between the (k+1)th page group and the common source line (CSL in FIG. 5) is greater than that between the kth page group and the common source line CSL. For example, least significant bit programs for the pages P1_2~P4_2 in the second page group are performed in sequence.

In step S130, most significant bit programs are performed about pages in the kth page group. For example, most significant bit programs for the pages P1_1~P4_1 in the first page group are performed in sequence.

In step S140, least significant bit programs for pages in a (k+2)th page group are performed. For example, the least significant bit programs for the pages P1_3~P4_3 in the third page group are performed in sequence.

Most significant bit programs for the pages P1_2~P4_2 in the second page group may be performed after least significant bit programs for the pages P1_3~P4_3 in the third page group are completed. The most significant bit programs for the pages P1_3~P4_3 in the third page group may be performed after least significant bit programs for the pages P1_4~P4_4 in the fourth page group are completed.

The pages P1_4~P4_4, P1_5~P4_5 and P1_6~P4_6 in the fourth to the sixth page groups are programmed in the above order, and the programming is shown in FIG. 11.

In one embodiment of the present invention, the most significant bit programs for the pages in the kth page group may be performed after the least significant bit programs for the pages in the (k+1)th page group are completed. As a result, data, especially upper bits data stored in the pages of the kth page group may not be affected by the least significant bit programs for the pages in the (k+1)th page group adjacent to the kth page group. Accordingly, reliability of the data stored in the pages of each of the page groups may be enhanced.

Figure 12:
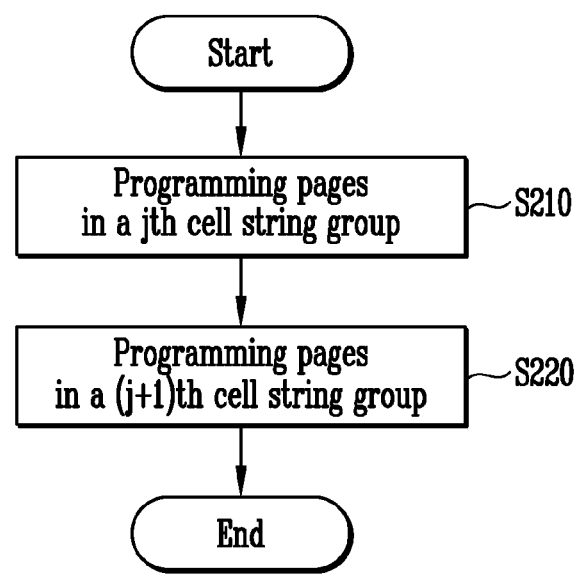
FIG. 12 is a flowchart illustrating operation of a semiconductor memory device according to an embodiment of the present invention.

FIG. 12 is a flowchart illustrating operation of a semiconductor memory device according to another embodiment of the present invention.

In FIG. 12, a plurality of pages configuring the jth cell string group is programmed in step S210. In step S220, a plurality of pages in the (j+1)th cell string group adjacent to the jth cell string group are programmed. That is, pages in next cell string group are programmed after all of pages in certain cell string group are programmed.

An order for the programming in FIG. 12 may be more easily understood comparing with that for the programming in FIG. 10. Accordingly, a user of the semiconductor memory device 100 may easily separate an area where the program operation is performed and an area where the program operation is not performed.

Figure 13:
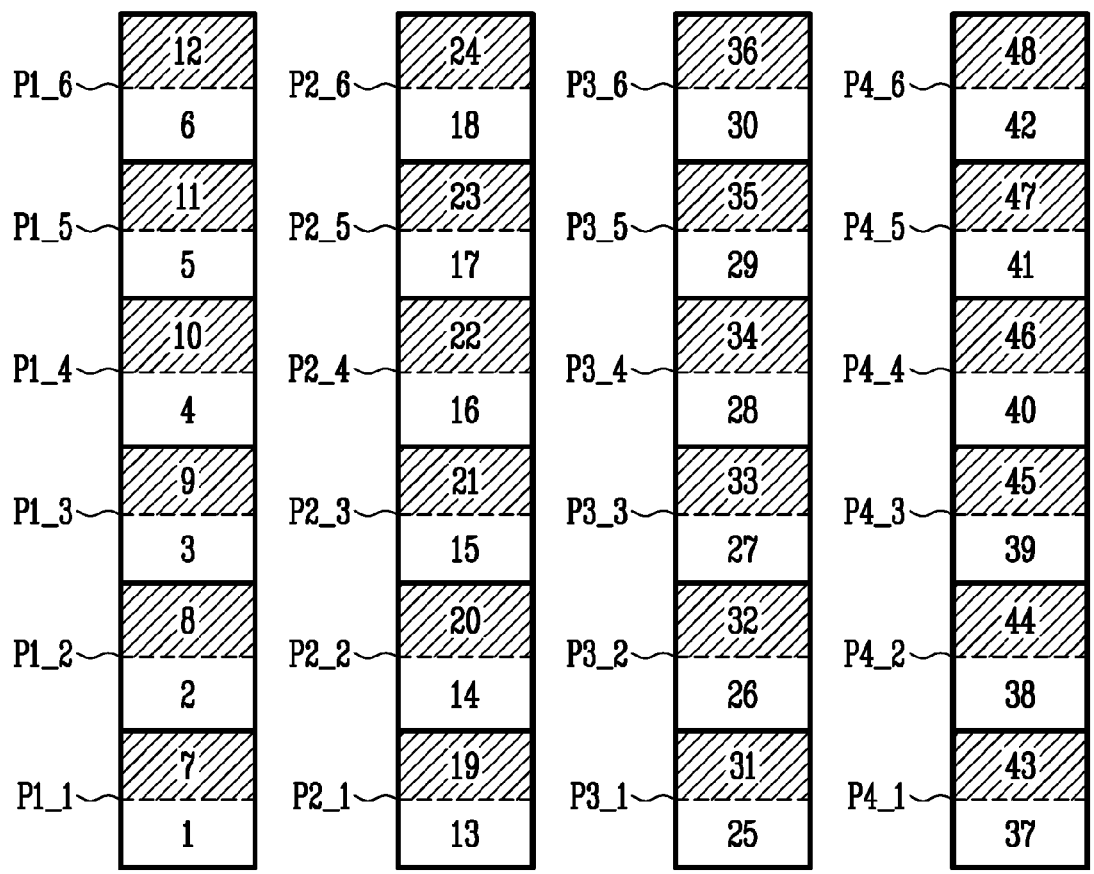
FIG. 13 is a view illustrating operation of the semiconductor memory device in FIG. 12 according to an embodiment of the present invention.

FIG. 13 is a view illustrating operation of the semiconductor memory device in FIG. 12 according to one embodiment of the present invention. In FIG. 13, order of least significant bit program and most significant bit program for pages is numbered.

In FIG. 13, least significant bit programs for the pages P1_1~P1_6 in the first cell string group are performed in sequence. The least significant bit programs for the pages P1_1~P1_6 in the cell string are performed in the order in accordance with the distance between each of the pages P1_1~P1_6 and the common source line (CSL in FIG. 5). After the least significant bit programs are completed, the most significant bit programs for the pages P1_1~P1_6 in the first cell string group are performed in sequence.

If the programming for the first cell string group is completed, programming for the second cell string group is performed. Least significant bit programs for the pages P2_1~P2_6 in the second cell string group may be performed in the order in accordance with distance between each of the pages P2_1~P2_6 and the common source line CSL. Most significant bit programs for the pages P2_1~P2_6 in the second cell string group may be performed in sequence after the least significant bit programs are completed.

The third cell string group and the fourth cell string group may be programmed in the above order, and the order is shown in FIG. 13.

Figure 14:
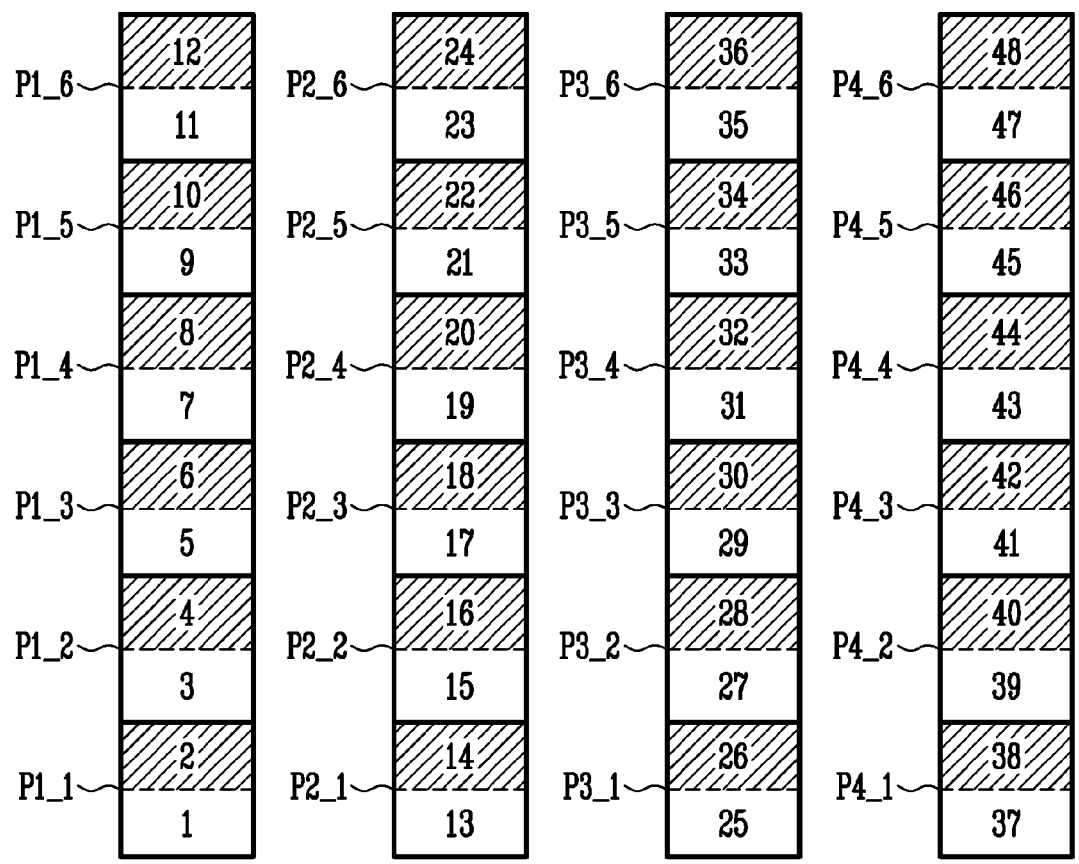
FIG. 14 is a view illustrating operation of a semiconductor memory device in FIG. 12 according to an embodiment of the present invention.

FIG. 14 is a view illustrating operation of a semiconductor memory device in FIG. 12 according to one embodiment of the present invention. In FIG. 14, order of least significant bit program and most significant bit program for pages is numbered.

In FIG. 14, when the pages P1_1~P1_6 in the first cell string group are to be programmed, least significant bit program and most significant bit program for next page may be performed after least significant bit program and most significant bit program for a selected page are completed. For example, least significant bit program and most significant bit program for the second page P1_2 are performed after least significant bit program and most significant bit program for the first page P1_1 in the first cell string group are completed. Here a distance between the common source line CSL and the second page P1_2 is greater than that between the common source line CSL and the first page P1_1. The third page to the sixth pages P1_3~P1_6 in the first cell string are programmed in the same manner.

Subsequently, the second cell string group is programmed. Least significant bit program and most significant bit program to each page in the second cell string group may be performed after least significant bit program and most significant bit program to a prior page are completed.

Figure 15:
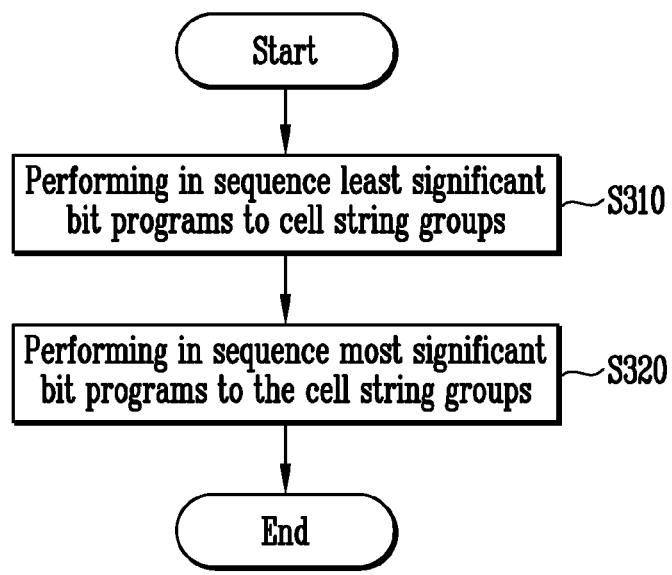
FIG. 15 is a flowchart illustrating operation of a semiconductor memory device according to an embodiment of the present invention.

FIG. 15 is a flowchart illustrating operation of a semiconductor memory device according to another embodiment of the present invention. FIG. 16 is a view illustrating operation of the semiconductor memory device in FIG. 15. In FIG. 16, order of least significant bit program and most significant bit program is numbered.

In FIG. 15 and FIG. 16, least significant bit programs for the first to the fourth cell string groups are programmed in sequence in step S310. That is, least significant bit programs for the pages P1_1~P1_6 in the first cell string group are performed, least significant bit programs for the pages P2_1~P2_6 in the second cell string group are performed, least significant bit programs for the pages P3_1~P3_6 in the third cell string group are performed, and least significant bit programs for the pages P4_1~P4_6 in the fourth cell string group are performed. Here, the pages in each cell string group may be programmed in the order in accordance with distance between each of the pages and a substrate.

In step S320, most significant bit programs for the first to the fourth cell string groups are performed in sequence. That is, after the least significant bit programs are completed, most significant bit programs for the pages P1_1~P1_6 in the first cell string group are performed, most significant bit programs for the pages P2_1~P2_6 in the second cell string group are performed, most significant bit programs for the pages P3_1~P3_6 in the third cell string group are performed, and most significant bit programs for the pages P4_1~P4_6 in the fourth cell string group are performed, sequentially. Here, the pages in each cell string group may be programmed in the order as a distance between each of the pages and the substrate in substantially the same manner as the least significant bit program.

A time taken for the least significant bit program is smaller than that taken for the most significant bit program.

Although every page in a selected memory block, e.g. BLK1 is not programmed, programming for pages in next memory block, e.g. BLK2 could be performed. For example, if a command for erase about the selected memory block is generated under the condition that a part of the pages in the selected memory block is programmed, following program operation may be performed about pages in a memory block being different from the selected memory block. In one embodiment of the present invention, the most significant bit programs are performed after the least significant bit programs are performed to every page in the memory block, the time taken for the least significant bit program being shorter than that taken for the most significant bit program. Therefore, program velocity of the semiconductor memory device 100 may be enhanced.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device including a plurality of cell string groups having pages stacked over a substrate,
   the plurality of cell string groups comprising first and second cell string groups, the first cell string group being commonly coupled to a first drain select line, the second cell string group being commonly coupled to a second drain select line, and the first cell string group and the second cell string group being commonly coupled to word lines,
   the method comprising:
   performing least significant bit programs to first pages of the first cell string group, the first pages being all of the pages in the first cell string group and being coupled to the word lines;
   performing most significant bit programs to the first pages after least significant bit programs to all of the first pages are performed;
   performing least significant bit programs to second pages of the second cell string group after most significant bit programs to the first pages are performed, the second pages being all of the pages in the second cell string group and being coupled to the word lines, and the second cell string group being adjacent to the first cell string group; and
   performing most significant bit programs to the second pages after least significant bit programs to the second pages are performed.

2. The method of claim 1, wherein the first pages are coupled between a common source line and a plurality of bit lines, and the least significant bit programs and the most significant bit programs to the first pages are performed in the order in accordance with a distance between corresponding page and the common source line.

3. The method of claim 1, wherein the second pages are coupled between the common source line and the plurality of bit lines, and the least significant bit programs and the most significant bit programs to the second pages are performed in the order in accordance with a distance between corresponding page and the common source line.

4. A method of operating a semiconductor memory device including a plurality of cell string groups having pages stacked over a substrate,
   the plurality of cell string groups comprising first and second cell string groups, the first cell string group being commonly coupled to a first drain select line, the second cell string group being commonly coupled to a second drain select line, and the first cell string group and the second cell string group being commonly coupled to word lines,
   the method comprising:
   performing least significant bit programs and most significant bit programs to all of the pages coupled to the word lines in the first cell string group; and
   performing least significant bit programs and most significant bit programs to all of the pages coupled to the word lines in the second cell string group after least significant bit programs and most significant bit programs to all of the pages in the first cell string group are performed, second cell string group being adjacent to the first cell string group,
   wherein the performing of least significant bit programs and most significant bit programs to all of the pages in the first cell string group includes:
   performing a least significant bit program and a most significant bit program to a first page of the first cell string group; and
   performing a least significant bit program and a most significant bit program to a second page of the first cell string group after the least significant bit program and the most significant bit program to the first page are performed.

5. The method of claim 4, wherein all of the pages in each of the first and second cell string groups are coupled between a common source line and bit lines,
   wherein a distance between the second page and the common source line is greater than distance between the first page and the common source line.

6. The method of claim 5, wherein the second page is adjacent to the first page.

7. The method of claim 5, wherein all of the pages in each of the first and second cell string groups coupled between a common source line and bit lines,
   wherein the performing of least significant bit programs and most significant bit programs to all of the pages in the second cell string group includes:
   performing a least significant bit program and a most significant bit program to a third page of the second cell string group; and
   performing a least significant bit program and a most significant bit program to a fourth page of the second cell string group, and
   wherein a distance between the fourth page and the common source line is greater than distance between the third page and the common source line.

8. The method of claim 7, wherein the fourth page is adjacent to the third page.

* * * * *